United States Patent
Anderson et al.

(10) Patent No.: US 6,323,647 B1
(45) Date of Patent: Nov. 27, 2001

(54) MOTOR DRIVEN TUNING AND MATCHING OF RF COILS IN AN NMR PROBE

(75) Inventors: Weston A. Anderson, Palo Alto; Howard D.W. Hill, Cupertino; Coriolan I. Frum; David H. Humber, both of Los Gatos, all of CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 09/397,366

(22) Filed: Sep. 16, 1999

(51) Int. Cl.$^7$ ........................................ G01V 3/00
(52) U.S. Cl. ........................................ 324/313; 324/320
(58) Field of Search ........................... 324/318, 309, 324/307, 320, 313; 600/407

(56) References Cited

U.S. PATENT DOCUMENTS

| 3,753,097 | * | 8/1973 | Dunand ............................... | 324/320 |
| 4,902,975 | * | 2/1990 | Kess .................................... | 324/318 |
| 5,041,788 | * | 8/1991 | Kontor et al. ...................... | 324/318 |
| 6,122,538 | * | 9/2000 | Sliwa, Jr. et al. ................. | 600/407 |

FOREIGN PATENT DOCUMENTS 0908 738 A2   4/1999   (EP) .

OTHER PUBLICATIONS

Advertisement entitled Automate NMR Using Inverse Probes at High Fields published by Bruker NMR. Publication date unknown.

* cited by examiner

Primary Examiner—Jay Patidar
Assistant Examiner—Tiffany A. Fetzmer
(74) Attorney, Agent, or Firm—Bella Fishman; Edward H. Berkowitz

(57) ABSTRACT

An apparatus for tuning and/or matching a RF coil in a NMR probe comprising a first variable capacitor electrically connected to the coil and a first motor capable of coupling to the first variable capacitor. The first motor when coupled to the first capacitor adjusts a capacitance associated with the first capacitor. The first motor is capable of operating in a strong magnetic field and is capable of not disturbing homogeneity of said magnetic field when said motor is not operating. The apparatus may further include a second variable capacitor and a second motor. The first motor is further capable of coupling to the second capacitor for adjusting a capacitance associated with the second capacitor. The second motor moves the first motor between coupling with the first capacitor and coupling with the second capacitor. The mechanism may be employed to manipulate variable inductive loads for tuning and/or matching.

29 Claims, 8 Drawing Sheets

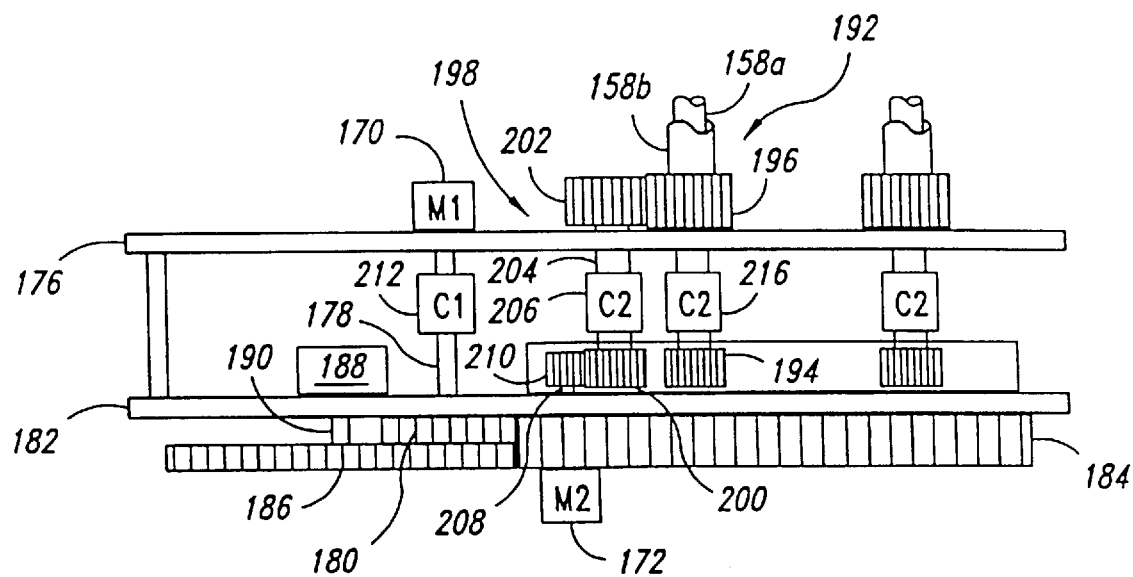
FIG. 6
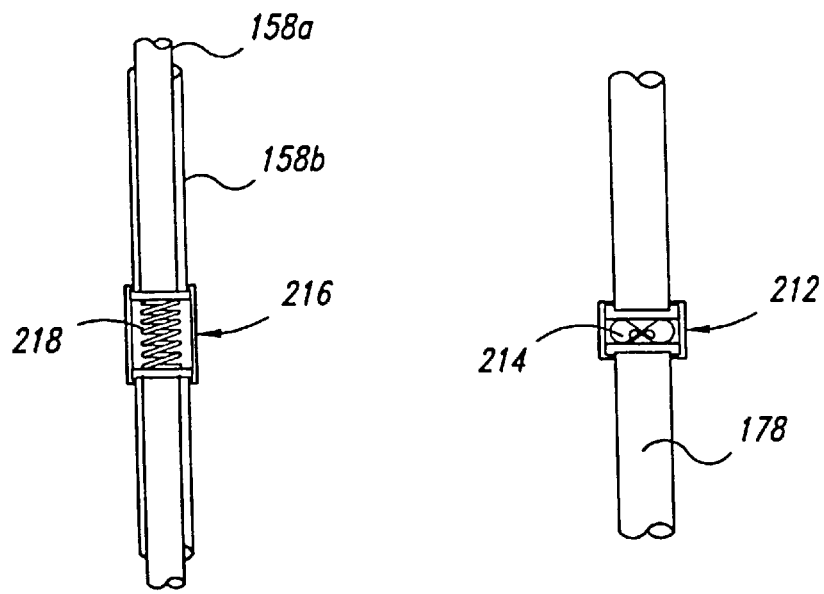
FIG. 8a
FIG. 8b

MOTOR DRIVEN TUNING AND MATCHING OF RF COILS IN AN NMR PROBE

FIELD OF THE INVENTION

The present invention relates generally to magnetic resonance. More particularly, the invention relates to tuning and matching radio frequency (RF) coils in a nuclear magnetic resonance (NMR) probe.

BACKGROUND OF THE INVENTION

Magnetic resonance may be used to analyze medical and/or chemical samples. Specifically, the diverse chemical constituents and/or the spatial distributions of such constituents of the sample may be analyzed through the application of the magnetic resonance phenomena. In general, the physical context of the invention is a NMR probe for nuclear magnetic resonance or magnetic resonance imaging. An idealized illustration is shown in FIG. 1.

A magnet 10 having bore 11 provides a main magnetic field. In order to control the magnetic field with precision in time and direction, there are provided magnetic field gradient coils (not shown). The gradient coils are driven by gradient power supplies 16, 18 and 20, respectively. Additionally, other shimming coils (not shown) and power supplies (not shown) may be required for compensating residual undesired spatial inhomogenities in the basic magnetic field. An object or fluid for analysis (hereinafter "sample") is placed within the magnetic field in bore 11; typically, the sample is placed in a sample space of an NMR probe (not shown) and the NMR probe is placed within the bore 11. The sample is subject to irradiation by RF power, such that the RF magnetic field is aligned in a desired orthogonal relationship with the magnetic field in the interior of bore 11. This is accomplished through a transmitter coil 12 in the interior of bore 11. Resonant signals are induced in a receiver coil, proximate the sample within bore 11. The transmitter and receiver coils may be the identical structure, or separate structures.

As shown in FIG. 1, RF power is provided from transmitter 24, and is amplified by an amplifier 31 and then directed via multiplexer 27 to the RF transmitter coil 12 located within the bore 11. The transmitter 24 may be modulated in amplitude or frequency or phase or combinations thereof, either upon generation or by a modulator 26. Transmitter and receiver coils are usually not concurrently used as such. The identical coil may be employed for both functions if so desired. Thus, a multiplexer 27 is provided to isolate the receiver from the transmitter. In the case of separate transmitter and receiver coils, element 27, while not precisely a multiplexer, will perform a similar isolation function to control receiver operation.

The modulator 26 is controlled by pulse programmer 29 to provide RF pulses of desired amplitude, duration and phase relative to the RF carrier at preselected time intervals. The pulse programmer may have hardware and/or software attributes. The pulse programmer also controls the gradient power supplies 16, 18 and 20, if such gradients are required. These gradient power supplies may maintain selected static gradients in the respective gradient coils if so desired.

The transient nuclear resonance waveform is processed by receiver 28 and further resolved in phase quadrature through phase detector 30. The phase resolved time domain signals from phase detector 30 are presented to Fourier transformer 32 for transformation to the frequency domain in accordance with specific requirements of the processing. Conversion of the analog resonance signal to digital form is commonly carried out on the phase resolved signals through analog to digital converter ("ADC") structures which may be regarded as a component of phase detector 30 for convenience.

It is understood that these resolved data signals from the phase detector 30 may be directly stored in a storage unit 34. The Fourier transformer 32 may, in practice, act upon a stored (in storage unit 34) representation of the phase resolved data. This reflects the common practice of averaging a number of time domain phase resolved waveforms to enhance the signal to-noise ratio. The transformation function is then applied to the resultant averaged waveform. Display device 36 operates on the acquired data to present same for inspection. Controller 38, most often comprising one or more computers, controls and correlates the operation of the entire apparatus.

In conducting NMR experiments, the coil 12 must be tuned to the resonant frequency of the nuclei to be observed. Additionally, the impedance of the coil 12 should be electrically matched to the impedance of the transmission line 19 which is optimally coupled through the multiplexer 27 to the receiver 28 to obtain the maximum transfer of energy and to obtain the best signal to noise ratio (SNR). To tune and match the coil 12, conventional NMR coils have variable capacitors. Typically, at least one variable capacitor is adjusted to tune the coil to the desired resonant frequency and at least another variable capacitor is adjusted to match the impedance of the coil. To adjust the capacitance of the variable capacitors, mechanical linkages are coupled to variable capacitors in the coil.

The probe is a critical component in NMR data acquisition. Among other functions, the NMR probe provides mechanical support for the sample and coil, and the NMR probe provides electrical connections between the coil and the NMR apparatus. The NMR probe is placed into the bore 11 to position the sample and coil in a preselected position along the center of the bore 11. FIG. 2 illustrates the mechanical structure of one example of a contemporary NMR probe 50. Briefly, the NMR probe 50 includes a box 52, three tuning rods 54a, 54b and 54c and a pair of board levels 56a and 56b. The coil (not shown) is located above the board level 56a e.g; axially beyond board level 56a. The sample is placed within the interior volume defined by the coil and typically in the center of the coil. For example, the coil may be a simple LC circuit with variable capacitors connected to the coil (not shown). The variable capacitors are typically located on the opposite side of the board level 56a as the coil.

To adjust the capacitances of the variable capacitors, the tuning rods 54a, 54b and 54c each comprise an assembly of concentric rods 58a and 58b. The concentric rods 58a and 58b are mechanical linkages that are coupled to the variable capacitors. The inner rod 58a rotates to adjust one of the variable capacitors on the board level 56a, and the outer rod 58b rotates to adjust another variable capacitor on the board level 56a. The box 52 supports the tuning rods 54a, 54b and 54c and the board levels 56a and 56b. Additionally, the box 52 houses connectors to the NMR probe that link the coil to the NMR apparatus described above. Furthermore, an outside shield tube (not shown) surrounds the tuning rods 54a, 54b and 54c, the board levels 56a and 56b, the variable capacitors and the coil.

When NMR experiments are performed, the box 52 is positioned outside the bore 11 the of magnet 10, and the board levels 56a and 56b are within the bore 11. To tune and match the coil for the NMR experiment, an operator manually rotates the mechanical nubs 60 associated with each concentric rod at the base of each tuning rod. Rotating the mechanical nubs 60 rotates the respective concentric rod of the tuning rod which adjusts the capacitance of the associated variable capacitor.

One shortcoming of the contemporary NMR probe is that the manual adjustment of the mechanical nubs 60 is inconvenient and inefficient. Because the NMR probe 50 is positioned largely within the bore 11 for experiments, the mechanical nubs 60 need to be adjusted by hand at the bore 11 away from the control console and display 36 of the NMR apparatus. The manual adjustment is also time consuming and troublesome.

Thus, it is desired to develop a NMR probe that may be tuned and matched remote from the probe. It is also desired to develop a NMR probe that may be efficiently and conveniently tuned and matched without interfering with the magnetic field of the NMR apparatus. Additionally, it is desired to develop a feedback system that enables automatic tuning and matching without aid from the operator.

SUMMARY OF THE INVENTION

In accordance with one aspect of the present invention, there is provided an apparatus for tuning a RF coil in a NMR probe comprising a variable capacitor electrically connected to the coil and a motor. The motor is coupled to the variable capacitor for adjusting a capacitance associated with the variable capacitor. The motor is capable of operating in a strong magnetic field and does not disturb homogeneity of the magnetic field when the motor is not operating.

In accordance with another aspect of the present invention, there is provided an apparatus for tuning and matching a RF coil in a NMR prove comprising a first variable capacitor, a second variable capacitor, a first motor and a second motor. The first motor is capable of coupling to the first variable capacitors to adjust a first capacitance associated the first capacitor and is capable of coupling to the second variable capacitor to adjust a second capacitance associated with the second capacitor. The second motor is capable of coupling the first motor to either the first capacitor or the second capacitor. The first motor and the second motor are capable of operating in a strong magnetic field and are of a type that does not disturb homogeneity of the magnetic field when the motors are not operating. The apparatus may further including a third variable capacitor with the first motor being capable of coupling to the third capacitor to adjust a third capacitance associated with the third capacitor. Additionally, the second motor is capable of moving the first motor to couple with the third capacitor. The second motor may linearly move the first motor between the coupling with the first capacitor and the coupling with the second capacitor. Alternately, the second motor may rotationally move the first motor between the coupling with the first capacitor and the coupling with the second capacitor. The coupling between the first motor and the first and second capacitors is through a mechanical linkage and gear system.

BRIEF DESCRIPTION OF THE DRAWINGS

Other aspects and advantages of the invention will become apparent upon reading the following detailed description and upon reference to the drawings.

FIG. 6 is a cross section of the NMR probe of FIG. 5 along line 6—6.

FIG. 7a is a cross section of the NMR probe of FIG. 5 along line 7a—7a.

FIG. 8a is a cross section of a clutch of the NMR probe of FIG. 5.

FIG. 8b is a cross section of another clutch of the NMR probe of FIG. 5.

Figure 1:
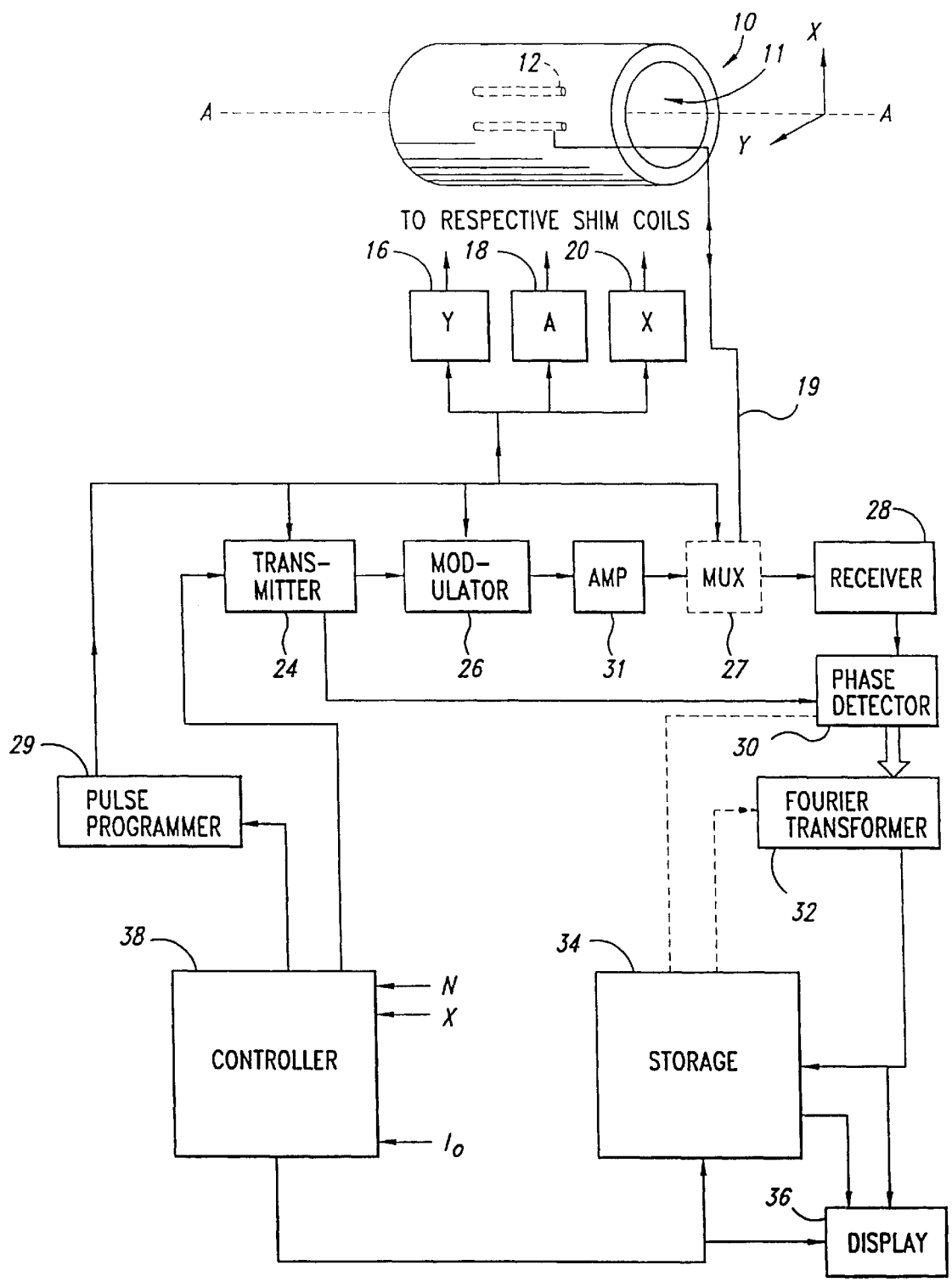
FIG. 1 is a schematic illustration of an NMR apparatus for the context of the invention.
Figure 2:
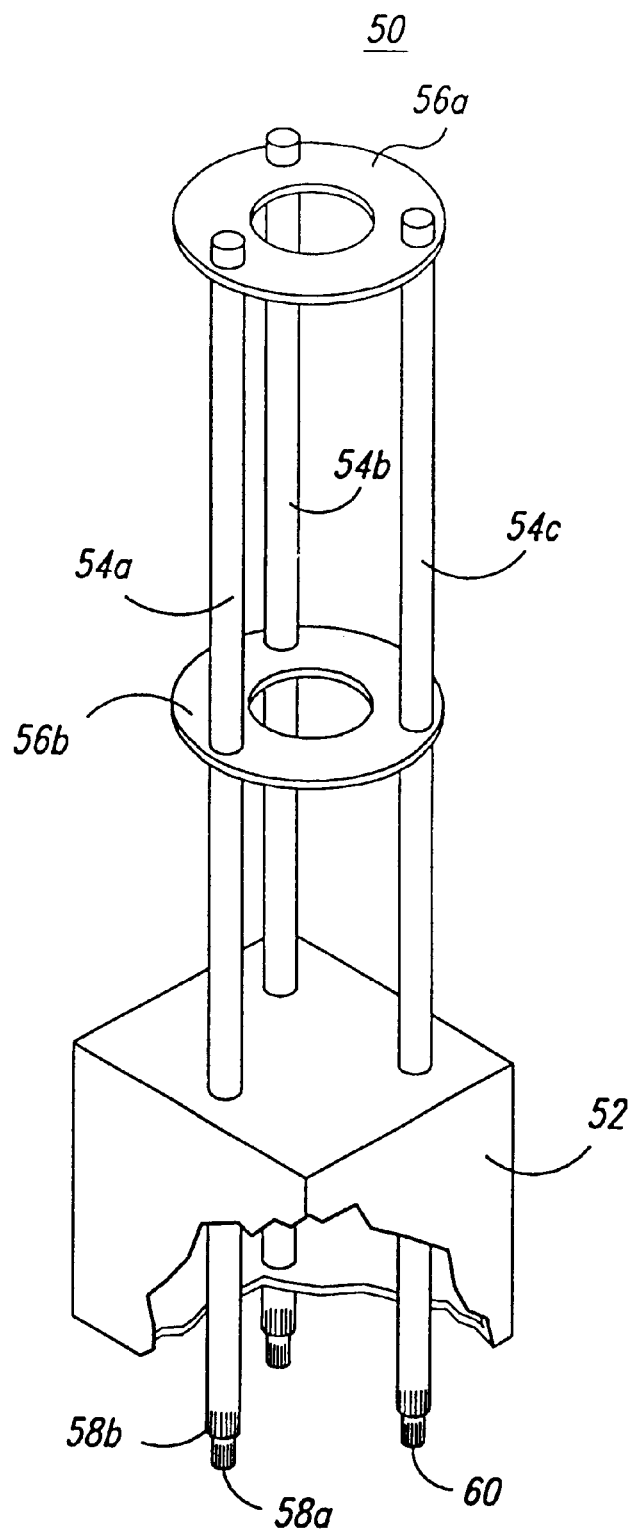
FIG. 2 is a perspective of the mechanical structure of one example of a contemporary NMR probe.

While the invention is susceptible to various modifications and alternative forms, specific embodiments thereof have been shown by way of example in the drawings and are herein described in detail. It should be understood, however, that the description herein of the specific embodiments is not intended to limit the invention to the particular forms disclosed, but on the contrary, the intention is to cover all modifications, equivalents, and alternatives falling within the spirit and scope of the invention as defined in the appended claims.

DETAILED DESCRIPTION OF THE INVENTION

Figure 3:
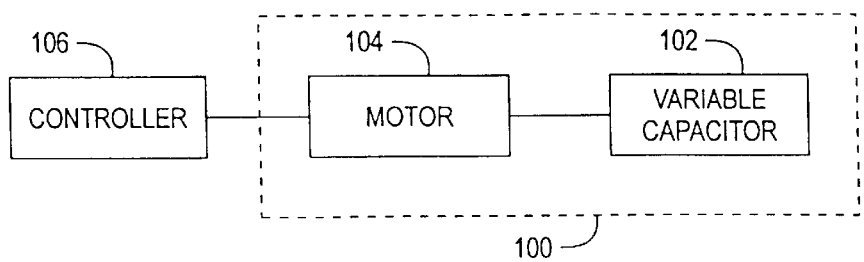
FIG. 3 is a block diagram of a system for tuning and matching a RF coil of an NMR probe.

Turning now to the drawings, FIG. 3 illustrates a simplified block diagram of the present invention for remotely tuning and/or matching a RF coil in an NMR probe. To remotely tune and/or match the NMR probe, the capacitance values of variable capacitors of the coil on the NMR probe must be adjusted. As depicted in FIG. 3, a small motor 104 in the NMR probe 100 is mechanically coupled to a variable capacitor 102. The motion of the motor 104 adjusts the capacitance value of the variable capacitor 102. To control the capacitance of the variable capacitor 102, a controller 106 controls the motion provided by the motor 104.

The motor 104 on the NMR probe that adjusts the variable capacitor 102 must meet stringent requirements not met by ordinary electric motors. When the motor 102 is not running, the motor 102 must not disturb the homogeneity of the applied magnetic field in the bore 11.

Additionally, the motor 102 must be able to operate in a strong magnetic field. Furthermore, for NMR probe coils using high temperature superconducting materials, the motor should be able to operate in a vacuum environment.

In one embodiment of the present invention, the motor on the NMR probe is an iron-free d.c. motor. The iron-free d.c. motor uses the strong magnetic field of the NMR magnet as a constant unidirectional field typically supplied by a field coil. If this field is vertical, the iron-free d.c. motor's armature with several coil pairs would rotate about a horizontal axis. The rotatable coils are coupled through brushes similar to conventional motors. By applying a d.c. current, the armature will rotate. Reversing the direction of the d.c.

current reverses the direction of rotation. The iron-free d.c. motor coupled to the variable capacitor rotates to adjust the capacitance for tuning and/or matching of the coil. During the acquisition of an NMR spectrum and after the tuning and/or matching of the coil, no current flows in the iron-free d.c. motor, thus, the iron-free d.c. motor produces no disturbances to the applied field.

In a preferred embodiment of the present invention, the motor on the NMR probe is a piezoelectric motor. The piezoelectric motor may provide either linear or rotational motion. In the piezoelectric motor, an oscillating electrical voltage applied to a piezoelectric material produces a moving or rotating wave. The moving or rotating wave is coupled to a friction plate causing the plate to move or rotate. The piezoelectric motor will operate at a relatively low speed and will provide a substantial force or torque. Additionally, the piezoelectric motor has a small size that will occupy little space on the NMR probe. An example of the piezoelectric motor is those sold by Shinsei.

In one embodiment, the controller 106 drives the piezoelectric motor 104 with an ultrasonic frequency (greater than 20 kHz) oscillating electrical voltage. In the preferred embodiment, the controller 106 comprises two 50 kHz sources that are 90° out of phase to each other. The controller 106 controls the speed of the motor 104 with the voltage applied to the motor 104, and the controller 106 controls the direction of the motor rotation with the electrical phase of the drives.

Figure 4:
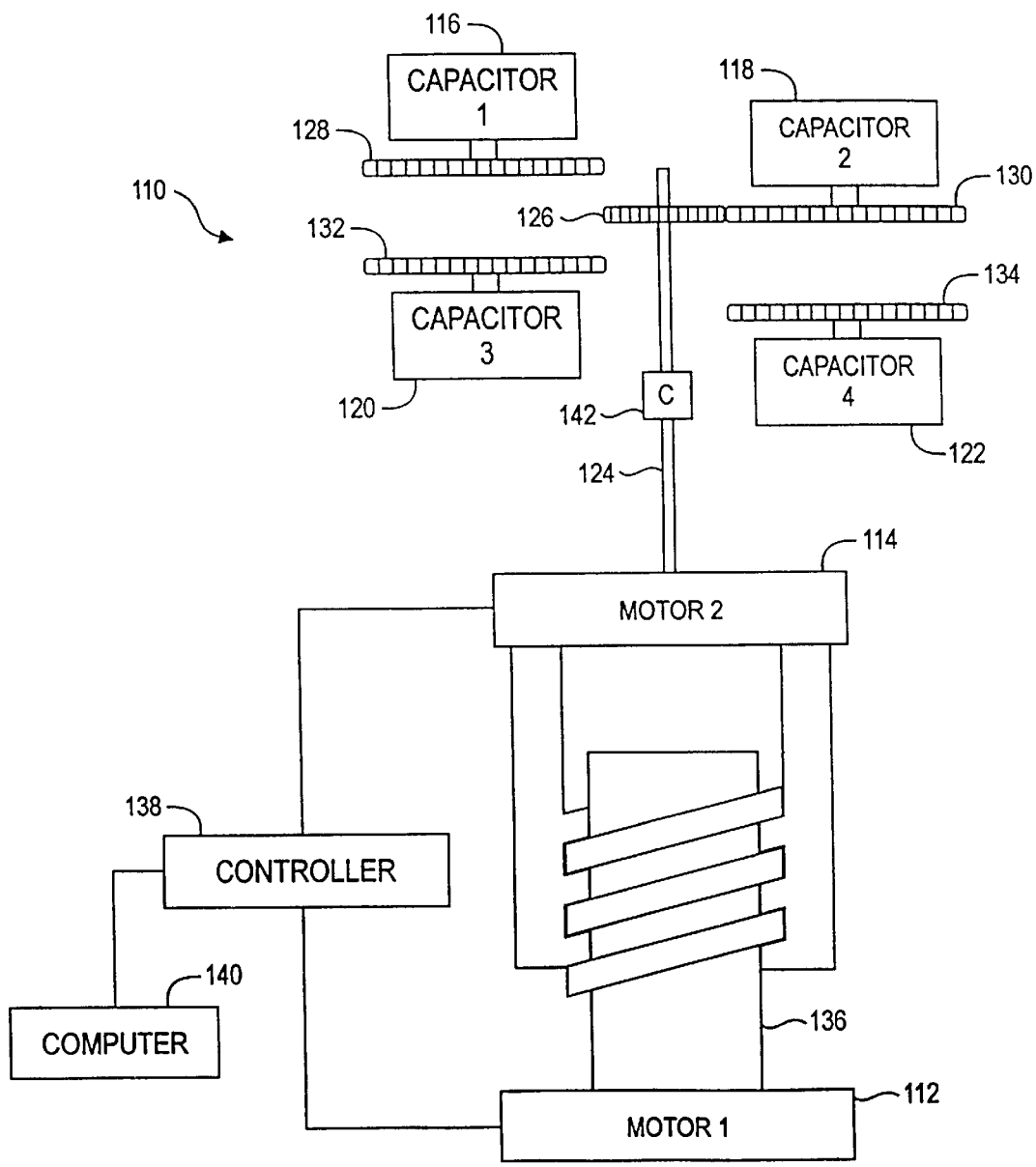
FIG. 4 is a perspective of one embodiment of the present invention for tuning and matching the coils of an NMR probe.

FIG. 4 illustrates another embodiment of the present invention for motor driven tuning and/or matching RF coils in an NMR probe 110. A pair of motors 112 and 114 work together to adjust several variable capacitors 116, 118, 120 and 122 in the NMR probe. In many cases, such as 2-D, 3-D NMR experiments, more than two variable capacitors need adjustment. Since the motors are expensive and space is limited within the NMR probe, it is desired to use the least number of motors possible to adjust the capacitors. The embodiment of FIG. 4 uses a switching motor 112 to mechanically switch an adjuster motor 114 between a number of capacitors 116, 118, 120 and 122. The names of the motors 112 and 114 serve only to help identify the function of the motor, namely the switching motor 112 moves the adjuster motor 114 into position to enable the adjuster motor 114 to change the capacitance of one of the variable capacitors. Once the switching motor 112 moves the adjuster motor 114 into position corresponding to the capacitor to be adjusted, the adjuster motor 114 rotates to adjust that capacitance.

As depicted in FIG. 4, the pair of motors 112 and 114 operate together to adjust several capacitors 116, 118, 120 and 122. The adjuster motor 116 rotates an adjuster shaft 124 containing an adjuster drive gear 126. The adjuster drive gear 126 is capable of engaging the adjuster driven gear 128, 130, 132 and 134 on each of the variable capacitors 116, 118, 120 and 122 respectively to adjust the capacitance of each variable capacitor 116, 118, 120 and 122. To protect the variable capacitors from breaking when they have been driven to their mechanical ends, the adjuster shaft 124 may include a clutch 142.

The switching motor 112 has a switching shaft 136 which raises and lowers the adjuster motor 114 to allow the adjuster drive gear 126 of the adjuster motor to mesh with the adjuster driven gear of each variable capacitor. As depicted in FIG. 4, using the switching motor 112 to select the capacitor to be adjusted and the adjuster motor 114 to adjust that capacitor's capacitance allows the four capacitors to be adjusted. Alternatively, more capacitors can be added with additional adjuster driven gears. Similar to the controller 106 described above with conjunction with FIG. 3, a controller 138 controls the motion of the switching and adjuster motors 112 and 114.

The NMR probes with motor driven tuning and matching of the RF coils of the above embodiments provide several advantages over the contemporary NMR probes. First, the motor driven NMR probes provide remote tuning and matching eliminating the manual adjustments of the conventional NMR probes. Instead of the operator manually adjusting the mechanical nubs of the conventional NMR probe by hand at the bore away from a control console and display of the NMR apparatus, the present invention enables the operator to tune and match the coils of the NMR probe at the control console of the NMR apparatus through inputs to the controller 138.

This not only is more convenient for the operator but it is more efficient and less time consuming.

Additionally, FIG. 4 depicts a computer 140 connected to the controller 138. The computer 140 together with the controller 138 may make automatic adjustments to the variable capacitors 116, 118, 120 and 122 for automatic tuning and matching of the coil. Using amplitude and phase information from the RF voltages used to activate the tuning circuits, capacitances may be automatically adjusted to match and tune the coil. An expert system trained by an operator could be used to optimize the tuning and matching controls automatically.

Furthermore, using a switching motor 112 to move the adjuster drive gear 126 between capacitors 116, 118, 120 and 122 and the adjuster motor 114 to rotate the adjuster drive gear 126 to adjust the selected capacitor simplifies the design of the NMR probe. The two motor system is capable of adjusting numerous capacitors to tune and/or match multi-frequency probes.

In one embodiment, a series of microswitches (not shown) may be used to indicate which capacitors are engaged at a particular time.

Moreover, the use of the two motor system frees up space in the critical regions of the NMR probe. This is particularly important in cryoprobes which are NMR probes that operate in a vacuum environment and at a low temperature of approximately 25 K. The conservation of space provided by the two motor system is essential for cyroprobes because these probes require additional space for the heat transfer system used to cool the probe coils. In addition, it is desirable to keep the number of heat paths to a minimum between the cold probe coils and the outside world. By using only one adjuster shaft 124 to select and control all of the variable capacitors 116, 118, 120 and 122 as illustrated in FIG. 4, the number of undesirable heat paths is minimized.

FIGS. 5–8 illustrate a NMR probe 150 of another embodiment of the present invention.

Figure 5:
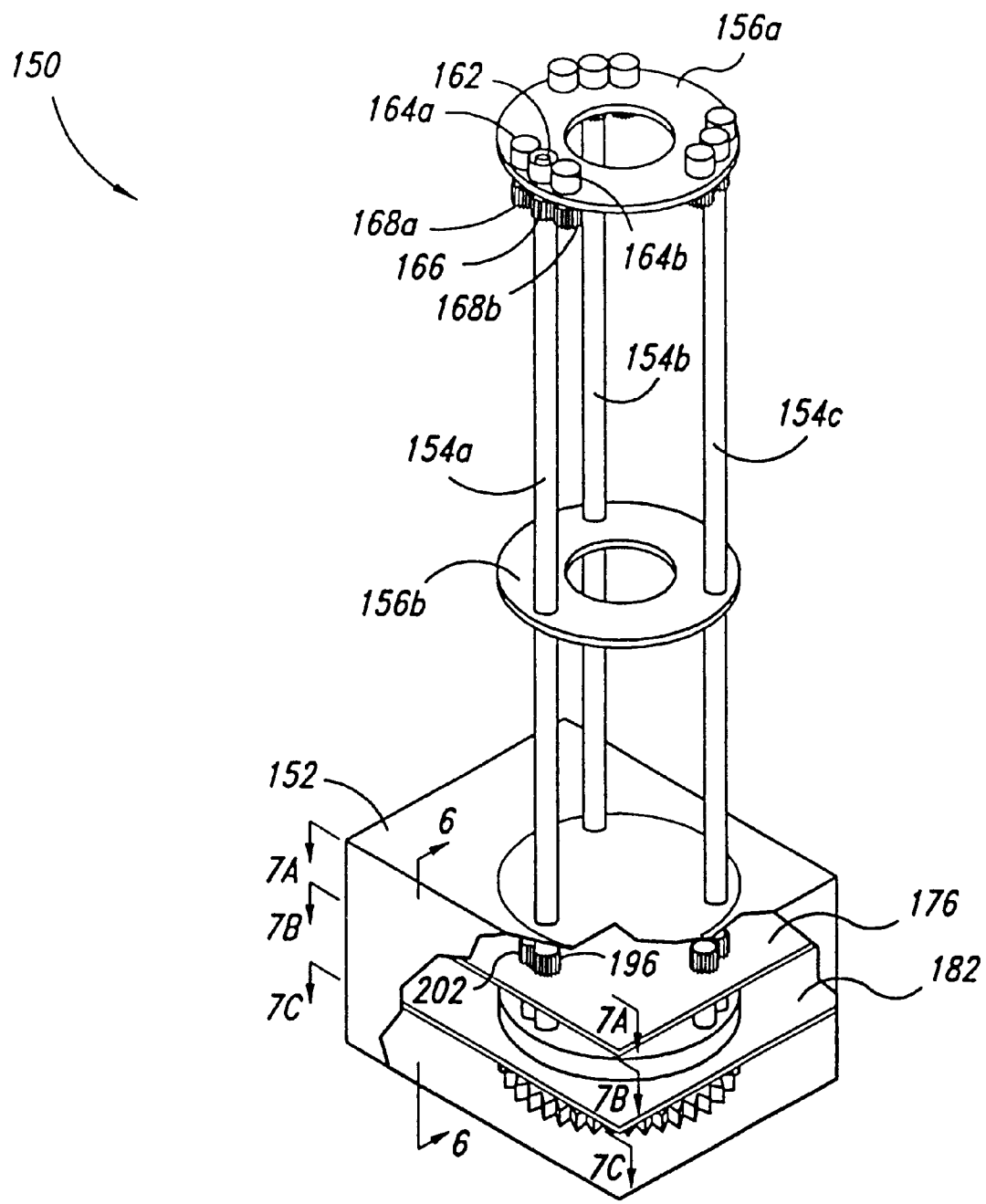
FIG. 5 is a perspective of an NMR probe of the present invention for tuning and matching the coils of the NMR probe.
Figure 7A:
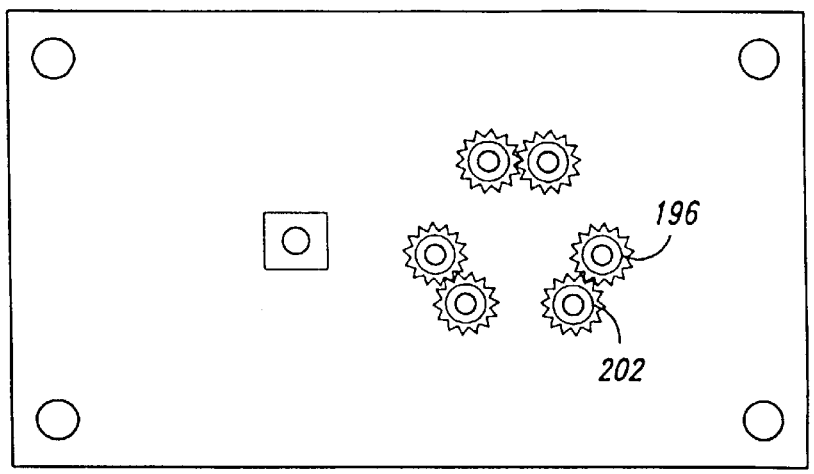
Figure 7B:
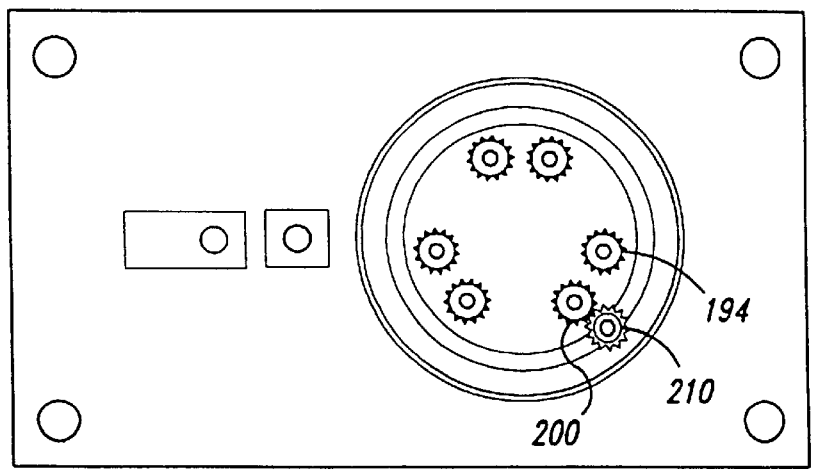
FIG. 7b is a cross section of the NMR probe of FIG. 5 along line 7b—7b.
Figure 7C:
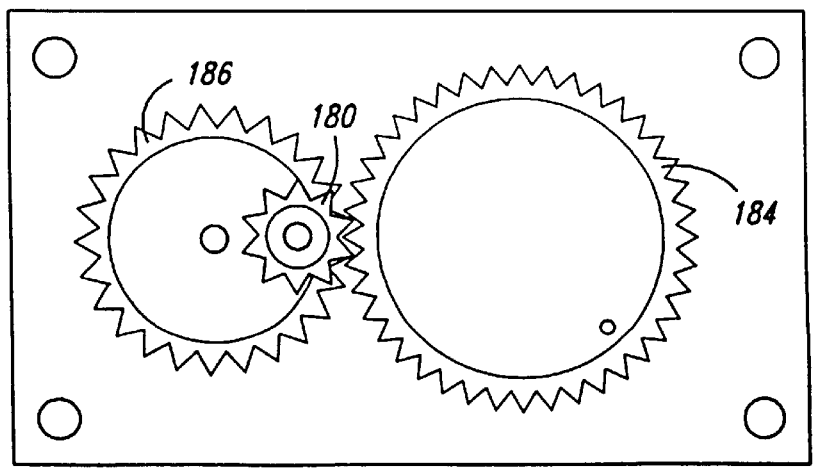
FIG. 7c is a cross section of the NMR probe of FIG. 5 along line 7c—7c.
Figure 9:
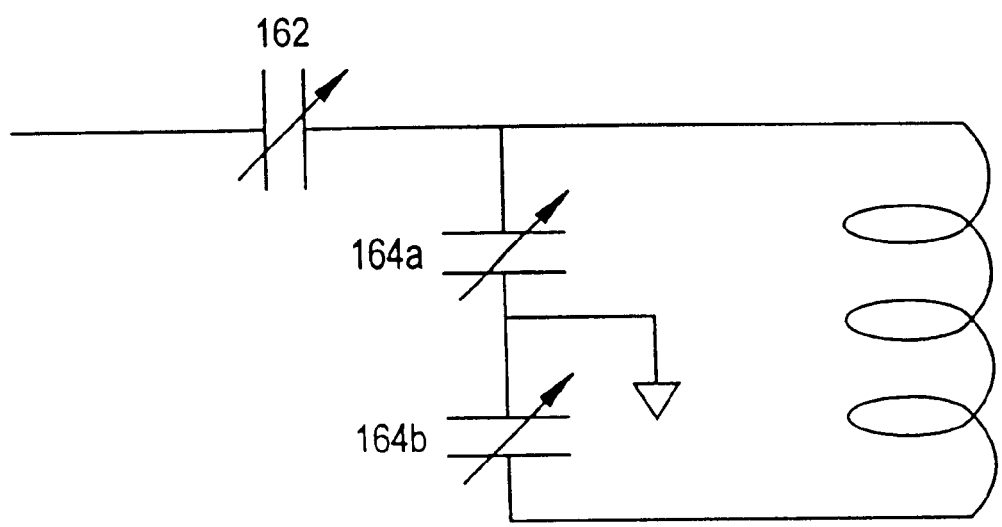
FIG. 9 is an electrical schematic diagram of a coil circuit.

In FIG. 5, instead of the switching motor linearly moving the adjuster motor, the motion is rotational. The NoM probe 150 depicted in FIG. 5 includes a box 152, three tuning rods 154a, 154b and 154c and a pair of board levels 156a and 156b. The coil (not shown) is located on top of the board level 156a and the sample would be positioned in the middle of the coil at the top of the board level 156a. The tuning rods 154a, 154b and 154c each comprise a pair of concentric rods 158a and 158b. The inner concentric rod 158a is coupled to a variable capacitor 162 on the board level 156a. The outer concentric rod 158b is coupled to a pair of variable capacitors 164a and 164b on the board level 156a. The variable capacitors 162, 164a and 164b are electrically connected to the coil. FIG. 9 illustrates one example of the coil circuit with variable capacitors 162, 164a and 164b. The variable capacitor 162 is for matching, and the variable capacitors 164a and 164b are for tuning. Other coil circuit arrangements are possible as known to one skilled in the art.

At the top board level 156a, the outer concentric rod 158b includes a rod drive gear 166 engaging a pair of rod driven gears 168a and 168b associated with the variable capacitors 164a and 164b respectively. The rotation of the inner rod 158a adjusts the capacitance of the variable capacitor 162, and the rotation of the outer rod 158b adjusts the capacitance of the variable capacitors 164a and 164b through their associated rod driven gears 168a and 168b. Because the tuning rods 154a, 154b and 154c have identical platforms of variable capacitors and mechanics for adjusting those capacitors, only one of the tuning rods 154a will be described in detail.

The box 152 supports the tuning rods 154a, 154b and 154c and the board levels 156a and 156b. Additionally, the box 152 houses the mechanics for adjusting the capacitance of the variable capacitors 162, 164a and 164b by rotating the concentric rods 158a and 158b which is best viewed in FIG. 6. To rotate each of the concentric rods 158a and 158b of the three tuning rods 154a, 154b and 154c, a switching motor 170 moves an adjuster motor 172 between each of the concentric rods 158a and 158b of the three tuning rods 154a, 154b and 154c. The switching motor 170 and the adjuster motor 172 may be piezoelectric motors with an appropriate controller as described above.

As depicted in FIG. 6, the switching motor 170 is mounted on a top plate 176 in the box 152. The switching motor 170 has a switching drive shaft 178 that drives a switching drive gear 180. The switching drive gear 180 is position below a bottom plate 182 in the box 152. The switching drive gear 180 meshes with a driven hub gear 184 such that when the switching drive shaft 178 rotates the switching drive gear 180 in a clockwise direction, the driven hub gear 184 rotates in a counter-clockwise direction. The adjuster motor 172 is mounted to the driven hub gear 184, so when the driven hub gear 184 rotates, the adjuster motor 172 moves with the driven hub gear 184. When the driven hub gear 184 rotates counter-clockwise, a position gear 186 rotates clockwise because the position gear 186 is meshed with the driven hub gear 184. The position gear 186 connects to an absolute angular encoder 188 through a position shaft 190. The absolute angular encoder 188 is mounted to the bottom plate 182, and the rotation of the position gear 186 provides the absolute angular encoder 188 with the position of the adjuster motor 172.

In one embodiment, a controller (not shown), similar to the one described in conjunction with FIG. 4, receives the position information from the absolute angular encoder 188.

Each of the tuning rods 154a, 154b and 154c have an adjuster gear assembly 192 that works with the adjuster motor 172 to adjust the variable capacitors associated with the tuning rod on the board level 156a. Only one of the adjuster gear assemblies 192 will be discussed because they each have identical structure and operation. The adjuster gear assembly 192 comprises a driven inner gear 194 connected to the inner concentric rod 158a, a driven outer gear 196 connected to the outer concentric rod 158b, and an outer adjuster assembly 198. The outer adjuster assembly 198 comprises a driven bottom gear 200 connected to an upper drive gear 202 by a shaft 204 having an outer clutch 206. The upper drive gear 202 meshes with the driven outer gear 196. For the adjuster motor 172 to cooperate with the gear assembly 192, the adjuster motor 172 has adjuster shaft 208 connected to a adjuster drive gear 210.

To adjust the inner variable capacitor 162, the adjuster motor 172 rotates the inner concentric rod 158a. To rotate the inner concentric rod 158a, the switching motor 170 rotates the driven hub gear 184 to position the adjuster motor 172 such that the adjuster drive gear 210 meshes with the inner driven gear 194. Once the adjuster drive gear 210 engages the inner driven gear 194, the adjuster motor 172 rotates its adjuster drive shaft 208 and adjuster drive gear 210 to rotate the inner driven gear 194 which in turn rotates the inner concentric rod 158a.

To adjust the outer variable capacitors 164a and 164b, the adjuster motor 172 rotates the outer concentric rod 158b. To rotate the outer concentric rod 158b, the switching motor 170 rotates the driven hub gear 184 to position the adjuster motor 172 such that the adjuster drive gear 210 engages the bottom driven gear 200. Once the adjuster drive gear 210 engages the bottom driven gear 200, the adjuster motor 172 rotates its adjuster drive shaft 208 and adjuster drive gear 210 to rotate the bottom driven gear 200 and top drive gear 202. Because the top drive gear 202 meshes with the outer driven gear 196, the rotating adjuster motor 172 rotates the outer driven gear 196 which rotates the outer concentric rod 158b.

As depicted in FIG. 6, the switching drive shaft 178 between the switching motor 170 and switching drive gear 180 has a switching clutch 212. FIG. 8b illustrates the switching clutch 212 which includes a wave washer 214. The wave washer 214 performs as a slip clutch that slips when too much torque is applied to minimize mechanical stress. As similarly depicted in FIG. 6, the portion of the inner concentric rod 158a between the top plate 176 and bottom plate 182 has a inner rod clutch 216. The inner rod clutch 216 is identical to the outer clutch 206 on the outer adjuster assembly 198. FIG. 8a illustrates the inner rod clutch 216 which includes a spring 218. The clutch 216 has a spring 218 that prevents the variable capacitors 162, 164a and 164b from breaking when reaching their mechanical end. If the adjuster motor 172 rotates the inner rod 158a when the variable capacitor has reached its mechanical end, the torque provided by the motor 172 may break the mechanical end of the variable capacitor. To prevent this breaking, the spring 218 provides friction and absorbs the torque.

It will be appreciated that the present invention has generally been described with reference to a particular embodiment of the NMR probe 150 illustrated in FIGS. 5–8. The present invention is not limited to the particular embodiment described herein. For example, any number and arrangement of variable capacitors is possible. Additionally, the tuning rods and mechanical linkages for adjusting the variable capacitors may vary from those depicted and probe adjustments other than capacitive adjustments may be employed. For example, frictionally coupled contact rollers may be used in lieu of toothed gears where appropriate.

Figure 10:
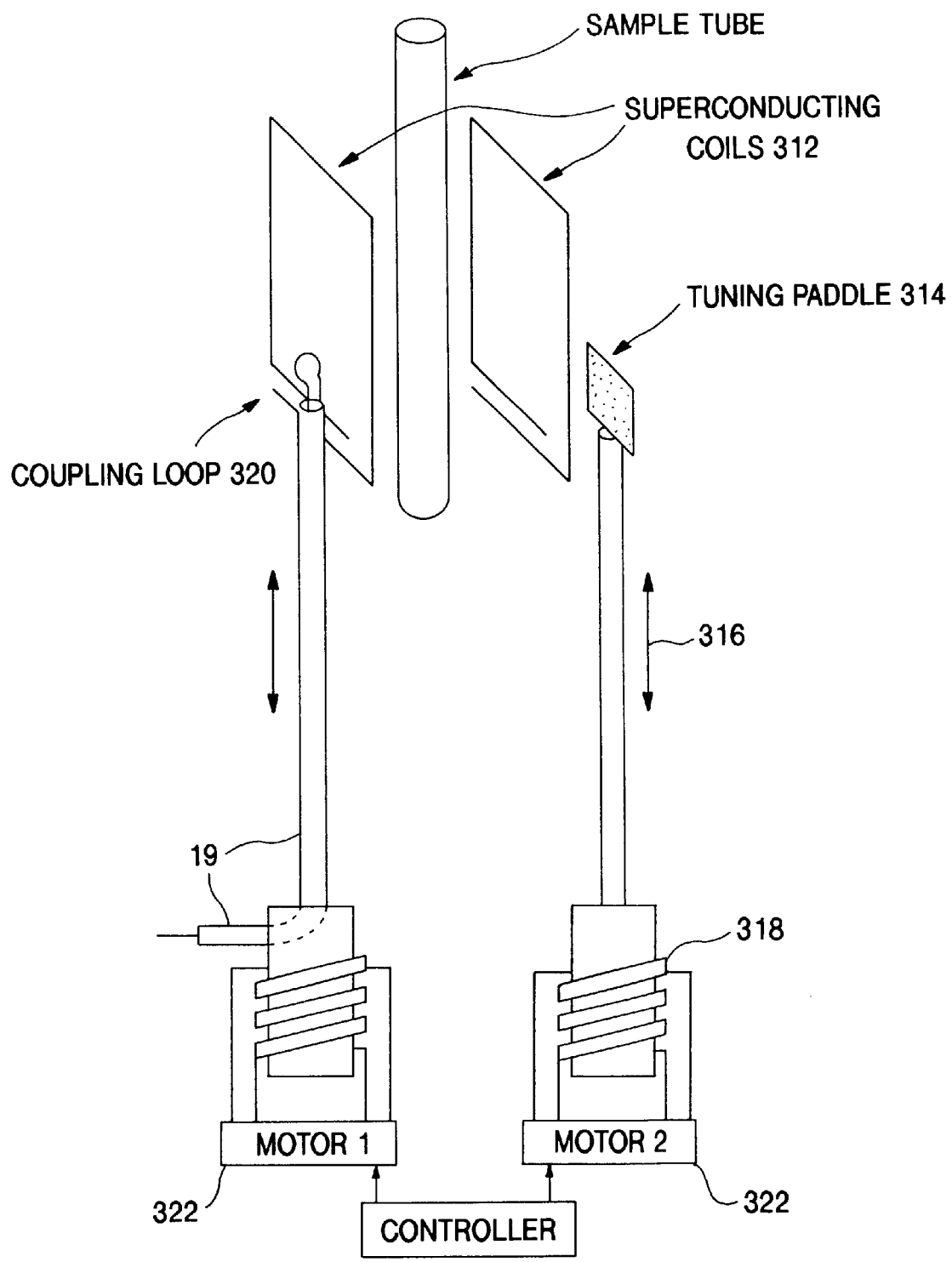
FIG. 10 shows a motor driven probe adjustment apparatus of the present invention that may be directed to the adjustment of tuning paddles of the NMR probe.

In another embodiment shown in FIG. 10, the motor driven probe adjustment apparatus of this invention, may be directed to the adjustment of tuning paddles 314 for an NMR probe coil and especially for cryogenic probe coils 312. The tuning paddle 314 is a conductive member, or plate, which is disposed in proximity to cryogenic probe coils 312 being a superconductive coil.

This serves as an inductive load which perturbs the field distribution of the coil. The paddle position relative to the coil is varied by rotation (as described above for capacitor adjustment), translation or a combination of translation and rotation, if desired. Translatory motion 316 is easily derived from the above described mechanisms by provision of a ball nut 318, for example, with paddle fixed thereto. In addition to the mechanical motion control of a tuning paddle, matching of probe impedance to an external signal source or sink is obtained in similar fashion. A typical arrangement for this purpose would provide for the movement of a coupling loop 320. By the same arrangement, capacitor adjustment may take the form of relative translation of capacitor plates of a linear variable capacitor. Other mechanisms for obtaining rotation or translation are within the purview of a probe equipped as here described with a motor(s) 322 which do not disturb the homogeneity of the surrounding field.

While particular embodiments and applications of the present invention have been illustrated and described, it is to be understood that the invention is not limited to the precise construction and compositions disclosed herein and that various modifications, changes, and variations will be apparent from the foregoing descriptions without departing from the spirit and scope of the invention as defined in the appended claims.

What is claimed is:

1. An apparatus for tuning a RF coil in a NMR probe comprising:
    a first and second variable capacitor electrically connected to said coil;
    a motor coupled to said first and second variable capacitors capable of adjusting a capacitance associated with both of said variable capacitors for tuning said coil, said motor capable of operating in a strong magnetic field and capable of not disturbing homogeneity of said magnetic field when said motor is not operating.

2. The apparatus of claim 1 wherein said motor is non-conductive.

3. The apparatus of claim 1 wherein said motor is a piezoelectric motor.

4. The apparatus of claim 1 wherein said motor is an iron-free d.c. motor.

5. An apparatus for tuning and matching a RF coil in a NMR probe comprising:
    a first variable capacitor electrically connected to said coil;
    a second variable capacitor electrically connected to said coil;
    a first motor capable of coupling to said first variable capacitor to adjust a first capacitance associated with said first capacitor for tuning said coil, said first motor also capable of coupling to said second variable capacitor to adjust a second capacitance associated with said second capacitor for matching said coil; and
    a second motor capable of coupling said first motor to either said first or said second capacitor.

6. The apparatus of claim 5 wherein said first motor and said second motor are capable of operating in a strong magnetic field and capable of not disturbing homogeneity of said magnetic field when said motors are not operating.

7. The apparatus of claim 5 wherein said first motor and said second motor are piezoelectric motors.

8. The apparatus of claim 5 wherein said first motor and said second motor are iron-free d.c. motors.

9. The apparatus of claim 5 further including a third variable capacitor, said first motor capable of coupling to said third capacitors to adjust a third capacitance associated with said third capacitor, said second motor capable of coupling to said third capacitor.

10. The apparatus of claim 5 wherein said second motor linearly moves said first motor between said coupling with said first capacitor and said coupling with said second capacitor.

11. The apparatus of claim 10 wherein said second motor has a rotatable drive shaft capable of moving said first motor between said coupling with said first capacitor and said coupling with said second capacitor.

12. The apparatus of claim 11 wherein said first motor includes a rotatable adjuster drive shaft for rotating an adjuster drive gear attached to said adjuster drive shaft, said adjuster drive gear capable of meshing with a first driven gear on said first capacitor to adjust said first capacitance and said adjuster drive gear capable of meshing with a second driven gear on said second capacitor to adjust said second capacitance.

13. The apparatus of claim 5 wherein said second motor rotationally moves said first motor between said coupling with said first capacitor and said coupling with said second capacitor.

14. The apparatus of claim 13 further including a drive gear connected to said second motor and a hub gear on which said first motor is mounted, said drive gear meshes with said hub gear such that said first motor rotates said drive gear to move said hub gear with said first motor between said coupling with said first capacitor and said coupling with said second capacitor.

15. The apparatus of claim 14 further including a position gear meshed with said hub gear and an encoder connected to said position gear for determining the position of said first motor.

16. The apparatus of claim 13 further including an inner tuning rod concentric with an outer tuning rod, each of said rods having a top and a base, said top of said inner tuning rod coupled to said first capacitor and said top of said outer tuning rod coupled to said second capacitor, said base of said inner tuning rod having an inner driven gear and said base of said outer tuning rod having an outer driven gear, said first motor capable of rotating an adjuster drive gear, said adjuster drive gear capable of coupling with said inner driven gear to adjust said first capacitance and capable of coupling with said outer driven gear to adjust said second capacitance.

17. The apparatus of claim 16 further including a outer linkage including a bottom driven gear at a bottom end of a linkage shaft and a top drive gear at a top of said linkage shaft, said top drive gear meshes with said outer driven gear, said adjuster drive gear capable of rotating said bottom driven gear which rotates said linkage shaft and said top drive gear to adjust said second capacitance.

18. The apparatus of claim 17 wherein said linkage shaft includes a slip clutch.

19. The apparatus of claim 16 wherein said inner tuning rod includes a slip clutch.

20. A method for tuning and matching a RF coil in a NMR probe having a first variable capacitor and a second variable capacitor comprising the steps of:
    providing first motor capable of coupling to said first variable capacitor to adjust a first capacitance associated with said first capacitor and capable of coupling to said second variable capacitor to adjust a second capacitance associated with said second capacitor;
    providing a second motor capable of moving said first motor between a first position and a second position, at said first position said first motor being coupled to said first capacitor and at said second position said first motor being coupled to said second capacitor;

actuating said second motor to move said first motor to said first position;

actuating said first motor to adjust said first capacitance for tuning said coil;

actuating said second motor to move said first motor to said second position; and actuating said first motor to adjust said second capacitance for matching said coil.

21. The method of claim 20 further including the step of determining whether said first motor is in said first position or said second position.

22. An apparatus for tuning and matching a RF coil in a NMR probe having a first variable capacitor with a first driven gear and a second variable capacitor with a second driven gear, said apparatus comprising:

a first motor capable of driving said first driven gear to adjust a first capacitance of said first capacitor and capable of driving said second driven gear to adjust a second capacitance of said second capacitor;

a second motor capable of moving said first motor between said first driven gear and said driving said second driven gear.

23. The apparatus of claim 22 further including:

a first rod concentric with a second rod and an adjuster drive gear connected to said first motor, said first and second rods each having a bottom end and a top end, said top end of said first rod having a first rod drive gear meshing with said first driven gear, said bottom end of said first rod having a first rod driven gear, said top end of said second rod having a second rod drive gear meshing with said second driven gear, said bottom end of said second rod having a second rod driven gear, said adjuster drive gear meshes with said first rod driven gear when said first motor driving said first driven gear, said adjuster drive gear meshes with said second rod driven gear when said first motor is driving said second driven gear.

24. The apparatus of claim 22 further including a third capacitor with a third driven gear and a fourth capacitor with a fourth driven gear, said first motor further capable of driving said third driven gear to adjust a third capacitance of said third capacitor and said fourth driven gear to adjust a fourth capacitance of said fourth capacitor, said second motor further capable of moving said first motor to selectively drive said first driven gear, said second driven gear, said third driven gear or said fourth driven gear.

25. The apparatus of claim 23 further including:

a third capacitor with a third driven gear;

a fourth capacitor with a fourth driven gear, said first motor further capable of driving said third driven gear to adjust a third capacitance of said third capacitor and said fourth driven gear to adjust a fourth capacitance of said fourth capacitor, said second motor further capable of moving said first motor to selectively drive said first driven gear, said second driven gear, said third driven gear or said fourth driven gear;

a third inner rod concentric with a fourth outer rod; and an adjuster drive gear connected to said first motor, said first, second, third and fourth rods each having a bottom end and a top end, said top end of said first rod having a first rod drive gear meshing with said first driven gear, said bottom end of said first rod having a first rod driven gear, said top end of said second rod having a second rod drive gear meshing with said second driven gear, said bottom end of said second rod having a second rod driven gear, said top end of said third rod having a third rod drive gear meshing with said third driven gear, said bottom end of said third rod having a third rod driven gear, said top end of said fourth rod having a fourth rod drive gear meshing with said fourth driven gear, said bottom end of said fourth rod having a fourth rod driven gear, said adjuster drive gear meshes with said first rod driven gear when said first motor drives said first driven gear, said adjuster drive gear meshes with said second rod driven gear when said first motor drives said second driven gear, said adjuster drive gear meshes with said third rod driven gear when said first motor drives said third driven gear, said adjuster drive gear meshes with said fourth rod driven gear when said first motor drives said fourth driven gear.

26. The apparatus of claim 22 wherein said first motor and said second motor are capable of operating in a strong magnetic field and capable of not disturbing homogeneity of said magnetic field when said motors are not operating.

27. The apparatus of claim 22 further including a drive gear connected to said second motor and a hub gear on which said first motor is mounted, said drive gear meshes with said hub gear such that said first motor rotates said drive gear to move said hub gear with said first motor between said driving said first driven gear and said driving said second driven gear.

28. An apparatus for controlled perturbation of an NMR resonator, comprising (a) an NMR superconductive coil, (b) a first and second perturbing member disposed in proximity to said superconductive NMR coil, said first and second perturbing members each comprising a conductor adapted to move in at least one degree of freedom, (c) a first and second motor coupled to said respective first and second perturbing members, for affecting controlled motion in said at least one degree of freedom, said first and second motors capable of operating in a strong magnetic field and leaving the homogeneity of said field undisturbed when said motor is not operating.

29. The apparatus of claim 28 wherein said first perturbing member is a tuning paddle, and said second perturbing member is a coupling loop.

* * * * *